United States Patent
Laaser

(10) Patent No.: US 12,308,822 B2
(45) Date of Patent: May 20, 2025

(54) SAW MULTIPLEXER WITH SWA FILTERS HAVING DIFFERENT BANDWIDTHS DUE TO DIELECTRIC LAYER BETWEEN IDT AND PIEZOELECTRIC LAYER ADJUSTING ACOUPLING FACTOR

(71) Applicant: RF360 SINGAPORE PTE. LTD., Republic Plaza (SG)

(72) Inventor: Peter Laaser, Bavaria (DE)

(73) Assignee: RF360 Singapore Pte. Ltd., Republic Plaza (SG)

( * ) Notice: Subject to any disclaimer, the term of this patent is extended or adjusted under 35 U.S.C. 154(b) by 435 days.

(21) Appl. No.: 17/641,406

(22) PCT Filed: Sep. 9, 2020

(86) PCT No.: PCT/EP2020/075201
§ 371 (c)(1),
(2) Date: Mar. 8, 2022

(87) PCT Pub. No.: WO2021/052836
PCT Pub. Date: Mar. 25, 2021

(65) Prior Publication Data
US 2022/0329229 A1    Oct. 13, 2022

(30) Foreign Application Priority Data
Sep. 16, 2019 (DE) ..................... 10 2019 124 861.2

(51) Int. Cl.
*H03H 9/145* (2006.01)
*H03H 9/25* (2006.01)
*H03H 9/64* (2006.01)

(52) U.S. Cl.
CPC .............. *H03H 9/145* (2013.01); *H03H 9/25* (2013.01); *H03H 9/64* (2013.01)

(58) Field of Classification Search
CPC ............ H03H 9/145; H03H 9/25; H03H 9/64; H03H 9/6406; H03H 9/6423; H03H 9/725; H03H 9/02543
See application file for complete search history.

(56) References Cited

U.S. PATENT DOCUMENTS 4,065,734 A * 12/1977 Takeno ............... H03H 9/02834
333/150
9,252,732 B2 * 2/2016 Yamashita ............... H03H 3/08
(Continued)

FOREIGN PATENT DOCUMENTS

CN    106209007 A    12/2016
CN    110999076 A *   4/2020    ............... H03H 3/10
(Continued)

OTHER PUBLICATIONS

International Search Report and Written Opinion—PCT/EP2020/075201—ISAEPO—Dec. 7, 2020.

*Primary Examiner* — Daniel Pihulic
(74) *Attorney, Agent, or Firm* — Polsinelli

(57) ABSTRACT

The SAW filter chip comprises a plurality of SAW filters (1, 2), wherein at least one of the several electric filters is a first-type electric filter (1) comprising at least one first-type SAW-resonator (10). The first-type SAW-resonator comprises a piezoelectric layer (11), an intermediate layer (12) on the piezoelectric layer (11) and an interdigital electrode structure (13) on the intermediate layer (12). The interdigital electrode structure is separated from the piezoelectric layer by the intermediate layer. The intermediate layer is made of a dielectric, non-piezoelectric material and adjusts the electromechanical coupling factor and the bandwidth of the respective filter. The plurality of SAW filters form an LTE multiplexer, wherein the thickness of the intermediate layer is chosen to adjust the required bandwidth to the desired (Continued)

bands. The intermediate layer may be absent for larger required bandwidths.

15 Claims, 3 Drawing Sheets

(56) References Cited

U.S. PATENT DOCUMENTS

| | | | | |
|---|---|---|---|---|
| 11,588,464 | B2* | 2/2023 | Huck | H03H 9/145 |
| 11,863,155 | B2* | 1/2024 | Daimon | H03H 9/25 |
| 11,870,421 | B2* | 1/2024 | Hiramatsu | H03H 9/6483 |
| 2008/0061657 | A1* | 3/2008 | Matsuda | H03H 9/0038 333/186 |
| 2008/0067891 | A1* | 3/2008 | Matsuda | H03H 9/0057 310/313 R |
| 2010/0277036 | A1 | 11/2010 | Shimizu et al. | |
| 2012/0200371 | A1* | 8/2012 | Yamashita | H03H 3/08 29/25.35 |
| 2014/0232239 | A1 | 8/2014 | Iwasaki et al. | |
| 2019/0028086 | A1* | 1/2019 | Takamine | H04B 1/0057 |
| 2019/0089335 | A1 | 3/2019 | Sauer et al. | |
| 2019/0267970 | A1 | 8/2019 | Nosaka | |
| 2019/0372551 | A1* | 12/2019 | Daimon | H03H 9/145 |
| 2021/0013871 | A1* | 1/2021 | Nosaka | H03H 9/706 |
| 2021/0058057 | A1* | 2/2021 | Goto | H03H 9/02559 |
| 2021/0126624 | A1* | 4/2021 | Hiramatsu | H03H 9/145 |
| 2021/0167748 | A1* | 6/2021 | Huck | H03H 9/02574 |
| 2022/0038071 | A1* | 2/2022 | Nakazato | H03H 9/02157 |
| 2022/0158611 | A1* | 5/2022 | Potratz | H03H 9/25 |
| 2022/0329229 | A1* | 10/2022 | Laaser | H03H 9/64 |

FOREIGN PATENT DOCUMENTS

| | | | | |
|---|---|---|---|---|
| CN | 113678370 A | * | 11/2021 | H03H 9/02574 |
| CN | 114391222 A | * | 4/2022 | H03H 9/02543 |
| CN | 116760382 A | * | 9/2023 | |
| DE | 102004038094 A1 | * | 3/2006 | H03H 3/10 |
| DE | 112009000281 T5 | | 2/2011 | |
| DE | 102018111013 A1 | * | 11/2019 | H03H 9/02574 |
| DE | 102019208602 A1 | * | 12/2019 | H03H 9/02 |
| DE | 102018118384 A1 | * | 1/2020 | H03H 9/1452 |
| DE | 102018124372 A1 | * | 4/2020 | H03H 9/02574 |
| DE | 102019109022 A1 | * | 10/2020 | H03H 9/02574 |
| DE | 102019124861 A1 | * | 3/2021 | H03H 9/02543 |
| GB | 2580496 A | * | 7/2020 | H03H 9/0009 |
| JP | 2004312653 A | * | 11/2004 | H03H 9/02653 |
| JP | 2005295496 A | | 10/2005 | |
| JP | 2008067289 A | | 3/2008 | |
| WO | 2019206534 | | 10/2019 | |
| WO | WO-2020201226 A1 | * | 10/2020 | H03H 9/02574 |
| WO | WO-2021052836 A1 | * | 3/2021 | H03H 9/02543 |

* cited by examiner

SAW MULTIPLEXER WITH SWA FILTERS HAVING DIFFERENT BANDWIDTHS DUE TO DIELECTRIC LAYER BETWEEN IDT AND PIEZOELECTRIC LAYER ADJUSTING ACOUPLING FACTOR

A filter chip and a first-type SAW-resonator are specified.

One task to be solved is to specify a space-saving filter chip for communication applications. Another task to be solved is to specify a first-type SAW-resonator for such a filter chip.

These tasks are solved, inter alia, by the subject-matters of the independent claims. Advantageous embodiments and further developments are the subject of the dependent claims.

According to at least one embodiment, the filter chip comprises several electric filters. The filters are integrated into the filter chip. By way of example, each of the filters is a bandpass filter or band-stop filter. Preferably, the filters are RF-filters. The filter chip comprises, for example, at least two or at least three or at least four or at least five electric filters.

Each electric filter comprises an input terminal and an output terminal. The filters are configured such that an RF-signal can be applied to the input terminal, is then filtered by the filter, and the filtered signal can be picked up at the output terminal. Preferably, in each filter the input terminal or the output terminal is connected to an antenna port of the filter chip. Additionally, each electric filter may comprise one or more ground terminals. Each electric filter preferably comprises one or more SAW-resonators (SAW=surface acoustic wave). For example, the electric filters are ladder-type filters comprising several serial SAW-resonators and several shunt SAW-resonators, also called parallel SAW-resonators. SAW-resonators are electro-acoustic resonators comprising an interdigital electrode structure on top of a piezoelectric layer.

The filter chip specified herein may particularly be used in communication devices, like mobile phones.

A chip is to be understood here and in the following as a separately operable and electrically contactable element. A chip is formed, in particular, by being singulated from a wafer. The chip may comprises a contiguous carrier substrate. The carrier substrate may be formed of a semiconductor material, for example of crystalline Si or of ceramic, like $Al_2O_3$. Lateral surfaces of the carrier substrate may comprise traces of a material removal resulting from singulating the chip out of the wafer. A lateral expansion of the chip is, for example, at most 1% or at most 5% or at most 10% greater than the lateral expansion of the carrier substrate. All electrical functional regions of the filter chip are preferably carried by the carrier substrate. A lateral expansion is an expansion measured parallel to the main extension plane of the chip.

According to at least one embodiment, at least one of the several electric filters is a first-type electric filter. A first-type electric filter is herein defined as a filter comprising at least one first-type SAW-resonator, which will be defined below. A first-type electric filter may comprise several first-type SAW-resonators. Preferably, a first-type filter only comprises first-type SAW-resonators. The filter chip may comprise only one first-type filter or several first-type filters.

A first-type SAW-resonator is herein defined as an SAW-resonator comprising a piezoelectric layer, an intermediate layer on the piezoelectric layer and an interdigital electrode structure on the intermediate layer. Thus, the intermediate layer is located between the interdigital electrode structure and the piezoelectric layer. Particularly, the interdigital electrode structure and the piezoelectric layer are both in direct contact with the intermediate layer.

The piezoelectric layer may be a thin-film. The piezoelectric layer is preferably applied on the carrier substrate of the filter chip. One or more dielectric, non-piezoelectric layers may be located between the carrier substrate and the piezoelectric layer. Alternatively, the piezoelectric layer itself may form the carrier substrate. For example, the piezoelectric layer is made of lithium tantalate, $LiTaO_3$, or lithium niobate, $LiNbO_3$, or quartz or another suitable piezoelectric material for SAW-resonators. The interdigital electrode structure and the intermediate layer are applied on a side of the piezoelectric layer facing away from the carrier substrate.

The interdigital electrode structure, for example, comprises two electrodes, each with a plurality of fingers. The fingers of the two electrodes interdigitate with each other. The electrodes are preferably formed of or comprise a metal or a metal layer stack. The electrodes of the interdigital electrode structure are preferably applied directly on the intermediate layer. Each electrode may comprise at least ten or at least 50 or at least 100 fingers. Particularly, the intermediate layer extends contiguously, preferably without interruptions, over all fingers of the electrode structure.

According to at least one embodiment, in the first-type SAW-resonator, the interdigital electrode structure is separated from the piezoelectric layer by the intermediate layer, preferably only by the intermediate layer. Thus, a distance between the interdigital electrode structure and the piezoelectric layer, particularly a distance between the electrodes of the electrode structure and the piezoelectric layer, is defined by the thickness of the intermediate layer.

According to at least one embodiment, the intermediate layer of the first-type SAW-resonator is made of a dielectric, non-piezoelectric material. The intermediate layer may be formed of only one material or may comprise several layers of different materials.

The features disclosed here and in the following for one first-type SAW-resonator are valid for every first-type SAW-resonator of the filter chip. In a first-type filter comprising several first-type SAW-resonators, the piezoelectric layer and/or the intermediate layer preferably extend contiguously over all first-type SAW-resonators of the first-type filter.

In at least one embodiment, the filter chip comprises several electric filters, wherein at least one of the several electric filters is a first-type electric filter comprising at least one first-type SAW-resonator. The first-type SAW-resonator comprises a piezoelectric layer, an intermediate layer on the piezoelectric layer and an interdigital electrode structure on the intermediate layer. The interdigital electrode structure is separated from the piezoelectric layer by the intermediate layer. The intermediate layer is made of a dielectric, non-piezoelectric material.

The present invention is based, inter alia, on the recognition that by using a thin, dielectric and non-piezoelectric intermediate layer between the electrode structure and the piezoelectric layer of an SAW-resonator, the coupling factor of the SAW-resonator and thus the pole-zero distance, i.e. the distance between the resonance and the anti-resonance of the SAW-resonator, can be reduced. This allows, for example, to reduce the bandwidth of the filter in which such an SAW-resonator is used. Indeed, the bandwidth of a filter is largely defined by the pole-zero distance of the used resonator(s). As a first approximation, the pole-zero distance of a resonator corresponds to about half of the bandwidth of the filter.

Usually, the maximum achievable pole-zero distance of an SAW-resonator is defined by the layer stack characteristics of the used SAW technology. The pole-zero distance can be reduced either by adding a capacitance in parallel to the resonator or by choosing an SAW layer stack/SAW technology having a smaller inherent pole-zero distance. However, in both cases, the area consumption of the resonator and thus of the filter is increased. As a consequence, such a filter can normally not be implemented together with further filters in one common chip.

With the present invention, using one or more first-type SAW-resonators with an intermediate layer, a small bandwidth filter with a small area consumption can be realized. A capacitance connected in parallel to the SAW-resonator is not needed anymore or the area of the parallel capacitance is significantly reduced. Such a filter together with further filters can be integrated in one filter chip.

According to at least one embodiment, a main mode acoustic wave of the first-type SAW-resonator of the first-type filter has a wavelength $\lambda$. The main mode acoustic wave is the acoustic wave for which the resonator is designed. During operation, a surface acoustic wave with such a wavelength is produced in the SAW-resonator. Particularly, the pitch between two adjacent fingers of the interdigital electrode structure is $\lambda/2$.

According to at least one embodiment, the thickness of the intermediate layer is at least $0.001 \cdot \lambda$ or at least $0.005 \cdot \lambda$. Additionally or alternatively the thickness of the intermediate layer is at most $0.05 \cdot \lambda$ or at most $0.02 \cdot \lambda$ or at most $0.01 \cdot \lambda$. In absolute values, the thickness of the intermediate layer may be at least 2 nm or at least 10 nm. Additionally or alternatively, the thickness may be at most 100 nm or at most 40 nm or at most 20 nm. With increasing thickness of the intermediate layer, the coupling factor of the first-type SAW-resonator is reduced. Thus, by adjusting the thickness of the intermediate layer, the pole-zero distance can be adjusted. Such a thin intermediate layer has only a small impact on the temperature coefficient of frequency of the resonator.

Preferably, the above-mentioned thickness for the intermediate layer applies to all first-type SAW-resonators, wherein in each case $\lambda$ is the wavelength of the main mode of the respective resonator.

A thickness of a layer is herein defined as the average thickness of the layer averaged over the whole lateral expansion of the layer.

According to at least one embodiment, the intermediate layer has a lower relative permittivity $\varepsilon_r$ than the piezoelectric layer. Preferably, the relative permittivity $\varepsilon_r$ is at most 10 or at most 8 or at most 5 or at most 3. A low relative permittivity $\varepsilon_r$ is preferred, since the lower the relative permittivity $\varepsilon_r$, the stronger is the reduction of the coupling factor and, thus, the stronger is the reduction in the pole-zero distance.

According to at least one embodiment, the intermediate layer comprises or consists of one or more of the following materials: $Al_2O_3$, $MgO$, $ZrO_2$.

According to at least one embodiment, each filter of the filter chip is a passband filter. Two filters of the filter chip preferably have different bandwidths and/or different center frequencies.

According to at least one embodiment, the at least one first-type filter is a passband filter with a bandwidth of at most 20 MHz or at most 10 MHz.

According to at least one embodiment, the filter chip is a multiplexer, for example a duplexer or a quadplexer or a pentaplexer. Particularly, the filter chip comprises one or more transmitter filters (Tx-filters) and/or one or more receiver filters (Rx-filters). The at least one first-type filter may be a transmitter filter or a receiver filter.

According to at least one embodiment, the intermediate layer is deposited by atomic layer deposition (ALD). Atomic layer deposition allows to produce particularly thin and homogeneous layers. A maximum deviation of the layer thickness from the average thickness is, for example, at most 10% or at most 5% or at most 2%.

According to at least one embodiment, each filter comprises at least one, i.e. one or more, SAW-resonator. Each SAW-resonator comprises an interdigital electrode structure on top of a piezoelectric layer. The interdigital electrode structure may be applied directly on the piezoelectric layer or may be separated from the piezoelectric layer by an intermediate layer (first-type SAW-resonator). The features disclosed herein for the piezoelectric layer and the interdigital electrode structure in connection with the first-type SAW-resonator are likewise disclosed for every SAW-resonator of the filter chip.

According to at least one embodiment, the piezoelectric layers of all SAW-resonators of all filters are formed by a contiguous piezoelectric layer. This means that all SAW-resonators of the filter chip share the same piezoelectric layer. The piezoelectric layer preferably extends over the whole lateral expansion or over almost the whole lateral expansion of the filter chip. The piezoelectric layer is preferably simply connected, i.e. it is free of holes or interruptions.

According to at least one embodiment, at least one of the several filters is a second-type electric filter. A second-type electric filter is herein defined as a filter comprising at least one second-type SAW-resonator. A second-type SAW-resonator is defined below. A second-type filter may comprise several second-type SAW-resonators. Particularly, a second-type filter only comprises second-type SAW-resonators and no first-type SAW-resonators.

A second-type SAW-resonator is herein defined as an SAW-resonator comprising a piezoelectric layer and an interdigital electrode structure applied directly on top of the piezoelectric layer. The features disclosed for the interdigital electrode structure and the piezoelectric layer in connection with the first-type SAW-resonator are likewise disclosed for the second-type SAW-resonator. The second-type SAW-resonators thus differ from the first-type SAW-resonators in that they do not comprise the intermediate layer between the electrode structure and the piezoelectric layer. The electrodes of the electrode structure, particularly metal layers of the electrodes, are thus directly applied to the piezoelectric material of the piezoelectric layer in a second-type SAW-resonator.

According to at least one embodiment, the at least one second-type filter is a bandpass filter with a bandwidth of at least 30 MHz or at least 50 MHz. In such a bandpass filter an intermediate layer is not needed.

According to at least one embodiment, the filter chip is a pentaplexer for LTE applications.

According to at least one embodiment, the filter chip comprises one first-type filter and four second-type filters. Particularly, the filter chip comprises exactly one first-type filter and exactly four second-type filters.

According to at least one embodiment, the first-type filter is an Rx-filter configured for the frequency band 30 (bandwidth=10 MHz).

According to at least one embodiment, two of the second-type filters are Tx-filters. One of these Tx-filters is configured for the frequency band 25 (bandwidth=65 MHz) and one of these Tx-filters is configured for the frequency band 66 (bandwidth=70 MHz).

According to at least one embodiment, two of the second-type filters are Rx-filters. One of these Rx-filters is configured for the frequency band 25 (bandwidth=65 MHz) and one of these Rx-filters is configured for the frequency band 66 (bandwidth=90 MHz).

The SAW-resonators mentioned herein may be TCF-SAW-resonators (TCF=temperature compensated filter). These SAW-resonators comprise a TCF compensation layer, for example of $SiO_2$, on top of the interdigital electrode structure.

Alternatively, the SAW-resonators mentioned herein may be thin-film SAW-resonators. In this case, a TCF compensation layer, for example of $SiO_2$, may be located between the piezoelectric layer and the carrier substrate.

Besides the filter chip, the present invention also concerns a first-type SAW-resonator as specified herein as well as a first-type filter specified herein.

Further preferred embodiments and developments of the filter chip and of the first-type SAW-resonator are described in the following in connection with the Figures. Equal or similar elements as well as elements of equal function are designated with the same reference signs in the Figures. The Figures and the proportions of the elements shown in the Figures are not regarded as being true to scale. Rather, single elements, in particular layers, can be shown exaggerated in magnitude for the sake of better presentation and/or better understanding.

Figure 1:
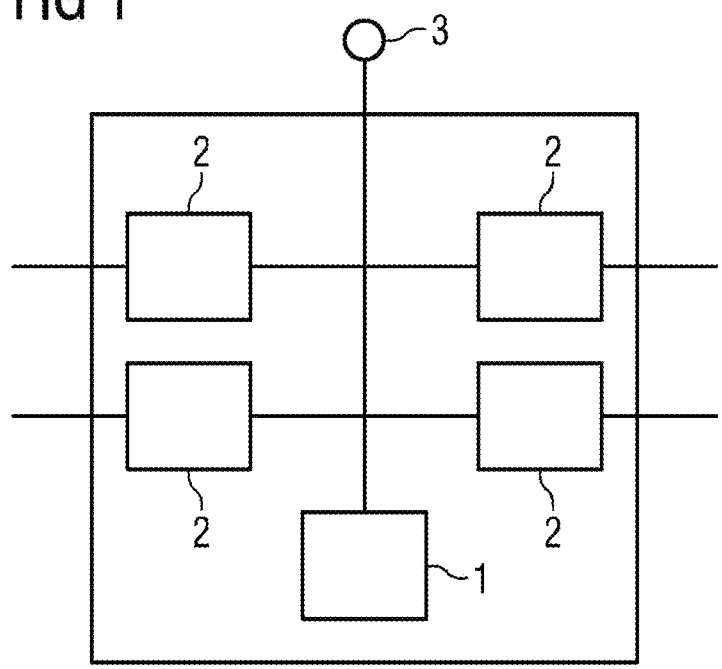
FIG. 1 shows an exemplary embodiment of the filter chip.

FIG. 1 shows an exemplary embodiment of the filter chip. The filter chip comprises four filters 1, 2. One filter 1 is a first-type filter and four filters are each second-type filters. The filters 1, 2 are all connected to an antenna 3. The antenna 3 is not part of filter chip.

The filter chip of FIG. 1 is a pentaplexer suitable for communication applications. For example, the filter chip of FIG. 1 can be used in mobile phones. By way of example, the first-type filter 1 is an Rx-filter configured for the LTE frequency band 30, two of the second-type filters 2 are Tx-filters configured for the LTE frequency bands 25 and 66, respectively, and the two remaining second-type filters 2 are Rx-filters configured for the LTE frequency bands 25 and 66, respectively.

Figure 2:
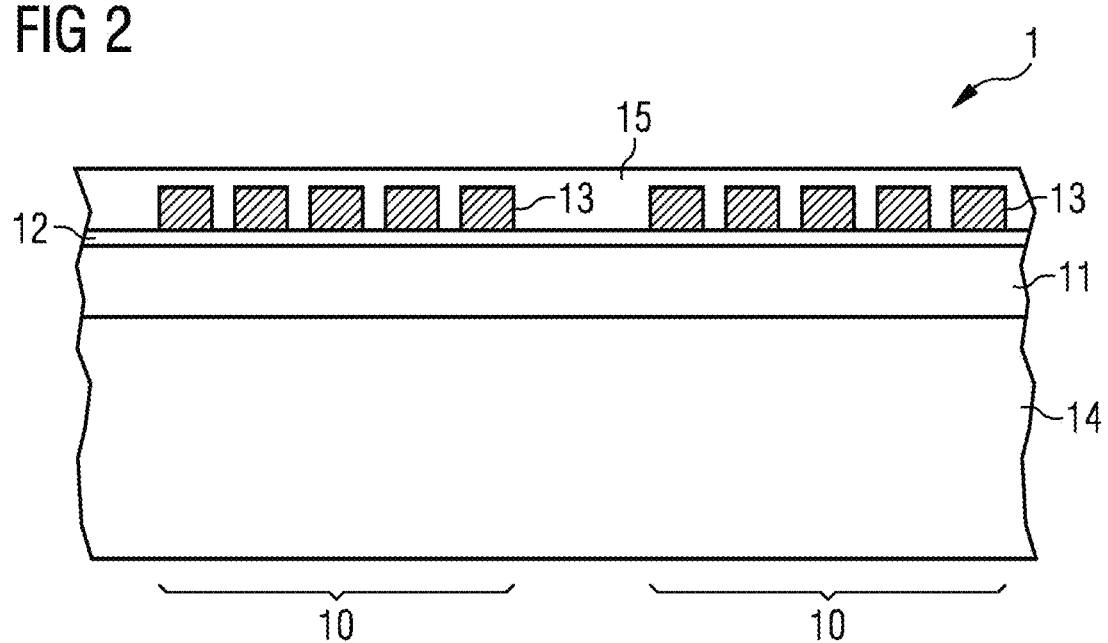
FIG. 2 shows a section of an exemplary embodiment of the first-type filter in a cross-sectional view.

FIG. 2 shows a section of an exemplary embodiment of the first-type filter 1, for example of the first-type filter 1 used in the filter chip of FIG. 1. The first-type filter 1 comprises a carrier substrate 14, for example made of Si. The carrier substrate 14 is preferably self-supporting and mechanically carries all structures applied on the carrier substrate 14. A piezoelectric layer 11 is applied on a top side of the carrier substrate 14. The piezoelectric layer 11 is made, for example, of $LiTaO_3$ or $LiNbO_3$. On a side of the piezoelectric layer 11 facing away from the carrier substrate 14, an intermediate layer 12 is applied. The intermediate layer 12 is in direct contact with the piezoelectric layer 11. The intermediate layer 12 consists of a dielectric, non-piezoelectric material. By way of example, the intermediate layer 12 is made of $Al_2O_3$. For example, the intermediate layer 12 was deposited with the help of Atomic Layer Deposition (ALD).

On a side of the intermediate layer 12 facing away from the piezoelectric layer 11, interdigital electrode structures 13 are applied. The electrode structures 13 each comprise electrodes, which are preferably made of a metal, like Al and/or Cu. The electrodes are in direct contact with the intermediate layer 12. The electrodes comprise fingers, wherein the fingers of the different electrodes interdigitate with each other.

In FIG. 2, two electrode structures 13, each with interdigitating electrodes, are applied on the intermediate layer 12. Each of the electrode structures 13 together with the piezoelectric layer 11 and the intermediate layer 12 forms a first-type SAW-resonator 10. The two first-type SAW-resonators 10 of FIG. 2 are, for example, connected in series. The first-type filter 1 of FIG. 2 may comprise further first-type SAW-resonators 10, for example first-type SAW-resonators 10 connected in parallel to the shown first-type SAW-resonators 10. The first-type filter 1 of FIG. 1 is, for example, a ladder-type filter.

On top of the electrode structures 13, a TCF compensation layer 15, for example made of $SiO_2$, is applied.

As can be seen in FIG. 2, the two first-type resonators 10 share the same piezoelectric layer 11, which extends contiguously over both first-type SAW-resonators 10. Likewise, the intermediate layer 12 extends contiguously over both first-type SAW-resonators 10.

The first-type SAW-resonators 10 of FIG. 1 are each configured for the excitation of a main mode acoustic wave with a wavelength $\lambda$. Particularly, the pitch between two adjacent fingers of the electrode structures 13 is $\lambda/2$. The thickness of the intermediate layer 12 is preferably at least $0.001 \cdot \lambda$ and at most $0.02 \cdot \lambda$. Such a thin intermediate layer 12 reduces the pole-zero distance in each of the first-type SAW-resonators 10. For example, the first-type filter 1 of FIG. 2 has a bandwidth of at most 20 MHz.

Figure 3:
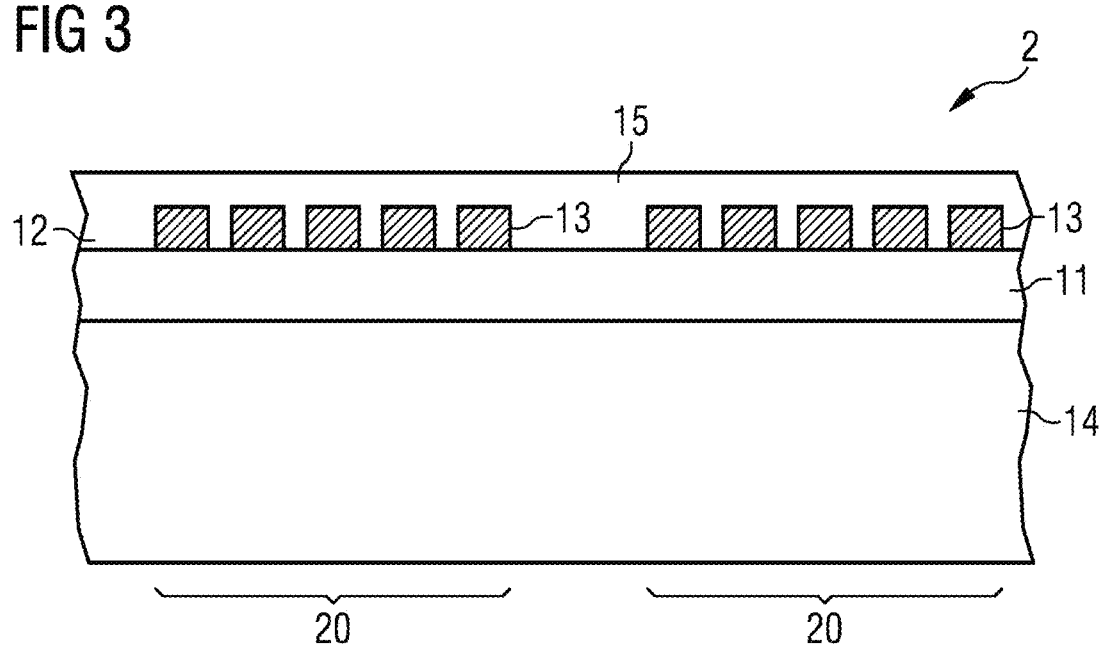
FIG. 3 shows a section of an example of a second-type filter in a cross-sectional view.

FIG. 3 shows a section of an example of a second-type filter 2. For example, the second-type filter 2 of FIG. 3 is one of the second-type filters 2 used in the filter chip of FIG. 1. The second-type filter 2 comprises two second-type SAW-resonators 20. The second-type SAW-resonators 20 are designed similarly to the first-type SAW-resonators 10 of FIG. 2, with the difference that no intermediate layer 12 is used. Instead, the electrodes of the electrode structures 13 are applied directly onto the piezoelectric layer 11.

In FIG. 1, a piezoelectric layer of the different filters 1, 2 preferably extends contiguously over all filters 1, 2.

Figure 4:
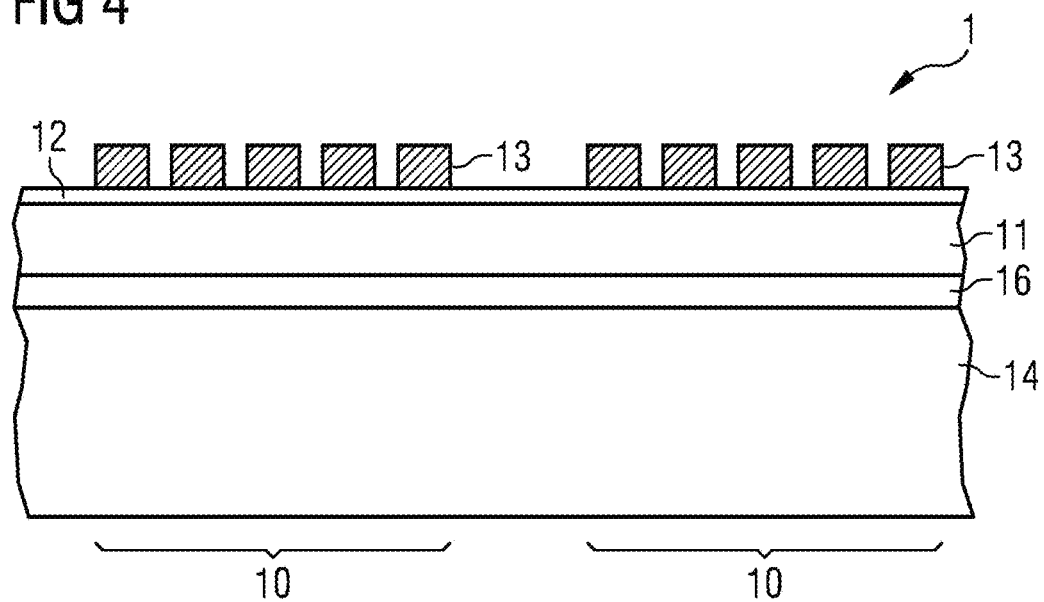
FIG. 4 shows a section of a further exemplary embodiment of a first-type filter in a cross-sectional view.

FIG. 4 shows a further exemplary embodiment of the first-type filter 1. Also this first-type filter 1 could be the first-type filter 1 of FIG. 1. The first-type filter 1 of FIG. 4 is designed similarly to the first-type filter 1 of FIG. 2. However, in this case, no TCF compensation layer is applied on top of the electrode structures 13. Instead, a TCF compensation layer 16, for example formed of $SiO_2$, is located between the carrier substrate 14 and the piezoelectric layer 11. The piezoelectric layer 11 of FIG. 4 is preferably a thin-film.

Figure 5:
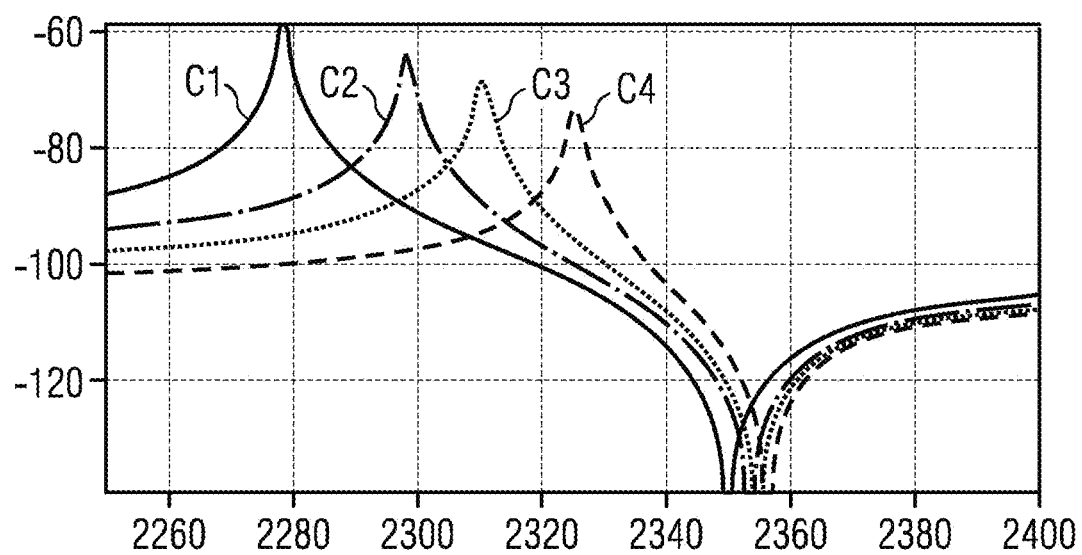
FIG. 5 shows the simulated admittance curves of different SAW-resonators.

FIG. 5 shows the simulated admittance curves of different SAW-resonators. The x-axis represents the frequency in MHz.

The y-axis represents the imaginary part of the admittance in arbitrary units.

The curve C1 represents the simulation results for a second-type SAW-resonator, in which the interdigital electrode structure is applied directly on the piezoelectric layer without using a dielectric, non-piezoelectric intermediate layer in between. The pole-zero distance, i.e. the distance between the resonance and the anti-resonance, is comparatively large.

The curves C2 to C4 represent the simulation results for first-type SAW-resonators. The design of the first-type SAW-resonators is almost identical to that of the simulated second-type SAW-resonator used for curve C1. The only difference is that for the first-type SAW-resonators a dielectric, non-piezoelectric intermediate layer was used between the interdigital electrode structures and the piezoelectric layer. For curve C2, the thickness of the intermediate layer was simulated to be 2.5 nm. For curve C3 the thickness was simulated to be 5 nm. For curve C4, the thickness was simulated to be 10 nm. As can be seen, with increasing thickness of the intermediate layer, the pole-zero distance can be reduced significantly. Thus, a first-type SAW-resonator can be used in filters for which a small bandwidth is desired.

The invention described herein is not limited by the description in conjunction with the exemplary embodiments. Rather, the invention comprises any new feature as well as any combination of features, particularly including any combination of features in the patent claims, even if said feature or said combination per se is not explicitly stated in the patent claims or exemplary embodiments.

REFERENCE SIGN LIST 1 first-type filter
2 second-type filter
3 antenna
10 first-type SAW-resonator
11 piezoelectric layer
12 intermediate layer
13 interdigital electrode structure
14 carrier substrate
15 TCF compensation layer
16 TCF compensation layer
20 second-type SAW-resonator
C1, C2, C3, C4 simulated admittance curves

The invention claimed is:

1. A filter chip comprising:
a first-type filter disposed on the filter chip and comprising a first-type surface acoustic wave (SAW)-resonator; and
a plurality of second-type filters disposed on the filter chip, each second-type filter comprising at least one second-type SAW-resonator;
wherein the first-type SAW-resonator comprises a piezoelectric layer, an intermediate layer on the piezoelectric layer, and an interdigital electrode structure on the intermediate layer, the interdigital electrode structure is separated from the piezoelectric layer by the intermediate layer, and the intermediate layer includes a dielectric, non-piezoelectric material; and
wherein the at least one second-type SAW-resonator comprises the piezoelectric layer and the interdigital electrode structure applied on top of the piezoelectric layer.

2. The filter chip according to claim 1, wherein;
a main mode acoustic wave of the first-type SAW-resonator of the first-type filter has a wavelength $\lambda$; and
a thickness of the intermediate layer is between $0.001 \cdot \lambda$ and $0.05 \cdot \lambda$ inclusive.

3. The filter chip according to claim 1, wherein the intermediate layer has a lower relative permittivity $\varepsilon_r$ than the piezoelectric layer.

4. The filter chip according to claim 1, wherein the intermediate layer comprises at least one of $Al_2O_3$, MgO, or $ZrO_2$.

5. The filter chip according to claim 1, wherein each of the first-type filter and the plurality of second-type filters comprises a passband filter.

6. The filter chip according to claim 1, wherein the first-type filter comprises a passband filter with a bandwidth of at most 20 MHz.

7. The filter chip according to claim 1, wherein the filter chip comprises a multiplexer.

8. The filter chip according to claim 1, wherein the intermediate layer is deposited by Atomic Layer Deposition.

9. The filter chip according to claim 1, wherein:
each filter comprises at least one SAW-resonator;
each SAW-resonator comprises an interdigital electrode structure on top of a piezoelectric layer; and
piezoelectric layers of all SAW-resonators of all filters are formed by a contiguous piezoelectric layer.

10. The filter chip according to claim 1, wherein the plurality of second-type filters each comprises a bandpass filter with a bandwidth of at least 30 MHz.

11. The filter chip according to claim 1, wherein:
the filter chip comprises a pentaplexer for communications applications;
the filter chip comprises a single first-type filter and four second-type filters;
the first-type filter is an Rx-filter configured for a first frequency band;
two of the plurality of second-type filters are Tx-filters, one configured for a second frequency band and one configured for a third frequency band; and
two of the plurality of second-type filters are Rx-filters, one configured for the second frequency band and one configured for the third frequency band.

12. A first-type surface acoustic wave (SAW)-resonator comprising:
a piezoelectric layer,
an intermediate layer on the piezoelectric layer;
a substrate;
a temperature compensation layer between the piezoelectric layer and the substrate; and
an interdigital electrode structure on the intermediate layer, wherein
the interdigital electrode structure is separated from the piezoelectric layer by the intermediate layer, and
the intermediate layer is made of a dielectric, non-piezoelectric material.

13. The filter chip according to claim 1, wherein the first-type SAW-resonator further comprises a temperature compensation layer between the piezoelectric layer and a substrate.

14. The filter chip according to claim 1, wherein the temperature compensation layer comprises a dielectric material.

15. The first SAW-resonator according to claim 12, wherein the temperature compensation layer comprises a dielectric material.

* * * * *